(12) United States Patent
Yoo et al.

(10) Patent No.: US 10,475,503 B2
(45) Date of Patent: Nov. 12, 2019

(54) CIRCUIT FOR SELECTING ROW TO BE REFRESHED

(71) Applicants: SK hynix Inc., Gyeonggi-do (KR); Seoul National University R&DB Foundation, Seoul (KR)

(72) Inventors: Sung-Joo Yoo, Seoul (KR); Mun-Gyu Son, Seoul (KR)

(73) Assignees: SK hynix Inc., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 15/984,858

(22) Filed: May 21, 2018

(65) Prior Publication Data

US 2018/0342281 A1    Nov. 29, 2018

(30) Foreign Application Priority Data

May 24, 2017 (KR) .......................... 10-2017-0064168

(51) Int. Cl.
| | | |
|---|---|---|
| *G11C 11/40* | (2006.01) | |
| *G11C 11/406* | (2006.01) | |
| *G11C 11/408* | (2006.01) | |
| *G11C 13/00* | (2006.01) | |

(52) U.S. Cl.
CPC ........ *G11C 11/406* (2013.01); *G11C 11/4085* (2013.01); *G11C 11/40611* (2013.01); *G11C 11/40615* (2013.01); *G11C 11/40622* (2013.01); *G11C 13/0033* (2013.01)

(58) Field of Classification Search
CPC ............ G11C 11/406; G11C 11/40615; G11C 11/40622; G11C 13/0033
See application file for complete search history.

(56) References Cited

U.S. PATENT DOCUMENTS

| | | | | |
|---|---|---|---|---|
| 9,257,169 | B2* | 2/2016 | Jung | ................. G11C 11/40622 |
| 9,812,185 | B2* | 11/2017 | Fisch | .................... G11C 11/406 |
| 2014/0355371 | A1* | 12/2014 | Kim | ...................... G11C 11/406 |
| | | | | 365/230.03 |
| 2017/0263305 | A1* | 9/2017 | Cho | ...................... G11C 11/408 |

FOREIGN PATENT DOCUMENTS

| | | |
|---|---|---|
| KR | 1020140139848 | 12/2014 |
| KR | 1020150072051 | 6/2015 |
| KR | 1020160011015 | 1/2016 |

OTHER PUBLICATIONS

Son, M. et al., Making DRAM Stronger Against Row Hammering, Design Automation Conference (DAC), 2017 54th ACM/EDAC/IEEE, 2017.

* cited by examiner

*Primary Examiner* — Vanthu T Nguyen (74) *Attorney, Agent, or Firm* — IP & T Group LLP (57) ABSTRACT

A circuit for selecting a row of memory cells of a memory device to be refreshed may include: a cold table suitable for storing as a cold row a row selected as a hammered row when the row selected as the hammered row is neither one of cold rows stored in the cold table nor one of hot rows stored in a hot table; and the hot table suitable for storing, as a hot row, the row selected as the hammered row when the row selected as the hammered row is one of the cold rows stored in the cold table.

20 Claims, 5 Drawing Sheets

CIRCUIT FOR SELECTING ROW TO BE REFRESHED

CROSS-REFERENCE TO RELATED APPLICATION

This application claims priority under 35 U.S.C. § 119 to Korean Patent Application No. 10-2017-0064168 filed on May 24, 2017, the disclosure of which is incorporated herein by reference in its entirety.

TECHNICAL FIELD

Exemplary embodiments relate to a memory device.

DISCUSSION OF THE RELATED ART

With an increase in the degree of integration of memories, the distance between a plurality of word lines included in a memory is gradually reduced. As the distance between the word lines is reduced, a coupling effect between adjacent word lines is increased.

Each time data is inputted into or outputted from a memory cell, the corresponding word line toggles between an enabled state and a disabled state. As described above, as the coupling effect between adjacent word lines is increased, there is generated a phenomenon in which data of memory cells coupled to a word line adjacent to a word line that is frequently enabled is damaged. This phenomenon is called "row hammering", which is problematic in that data of a memory cell is damaged by disturbance of the word line before the memory cell is refreshed.

Figure 1:
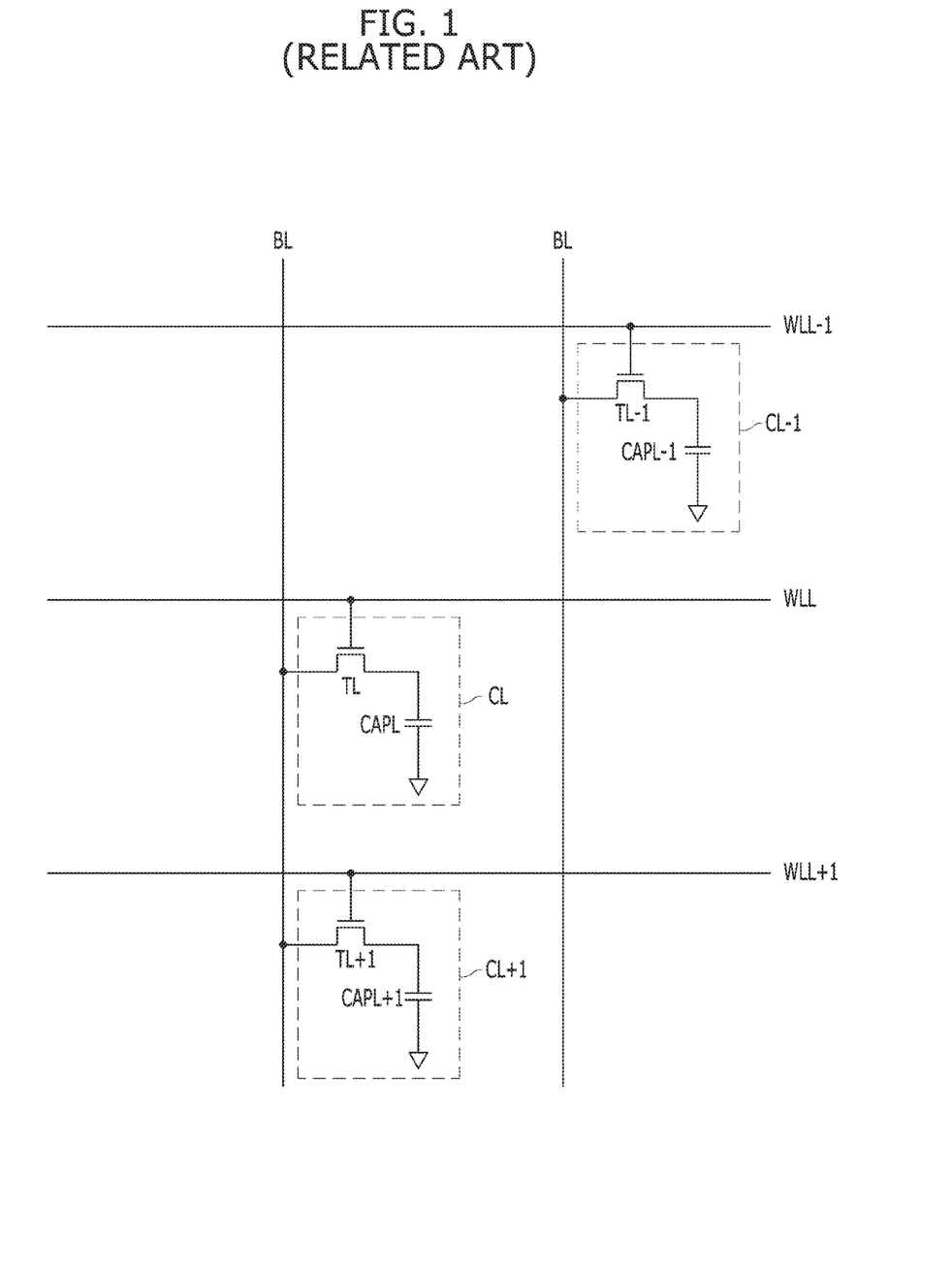
FIG. 1 is a diagram illustrating a portion of a cell array included in a memory device to describe a row hammering phenomenon.

FIG. 1 is a diagram illustrating a portion of a cell array included in a memory device to describe a row hammering phenomenon.

In FIG. 1, 'WLL' denotes a word line that has been enabled a large number of times, and 'WLL−1' and 'WLL+1' respectively denote word lines disposed adjacent to 'WLL', in other words, word lines disposed adjacent to the word line that has been enabled a large number of times. Furthermore, 'CL' denotes a memory cell coupled to 'WLL', 'CL−1' denotes a memory cell coupled to 'WLL−1', and 'CL+1' denotes a memory cell coupled to 'WLL+1'. Each of the memory cells includes a cell transistor TL, TL−1, TL+1 and a cell capacitor CAPL, CAPL−1, CAPL+1.

Referring to FIG. 1, when 'WLL' is enabled or disabled, the voltages of 'WLL−1' and 'WLL+1' are increased or reduced by a coupling phenomenon caused between 'WLL', 'WLL−1' and 'WLL+1', thus affecting the amount of electric charge of the cell capacitors CAPL−1 and CAPL+1. Therefore, if 'WLL' is frequently enabled and thus toggles between the enabled state and the disabled state, a change in the amount of charge stored in the cell capacitors CAPL−1 and CAPL+1 included in 'CL−1' and 'CL+1' is increased. Thereby, data in these memory cells may deteriorate.

Furthermore, electromagnetic waves generated when the word line toggles between the enabled state and the disabled state cause inflow or outflow of electrons into or from cell capacitors of memory cells coupled to adjacent word lines, thus causing damage to the data.

As a method for solving the row hammering phenomenon, a method of finding a row that has been enabled several times and refreshing rows adjacent to the several-times-enabled row is mainly used. As a method of finding a row that has been enabled several times, a method of counting the number of enabled times of every row enabled for a predetermined time is mainly used. However, in this case, there is a problem in that overhead is excessively increased.

SUMMARY

Various embodiments are directed to a circuit and method for more efficiently selecting rows to be refreshed for preventing data loss due to a row hammering phenomenon.

In an embodiment, a circuit for selecting a row of memory cells of a memory device to be refreshed may include: a cold table suitable for storing as a cold row a row selected as a hammered row when the row selected as the hammered row is neither one of cold rows stored in the cold table nor one of hot rows stored in a hot table; and the hot table suitable for storing, as a hot row, the row selected as the hammered row when the row selected as the hammered row is one of the cold rows stored in the cold table.

In an embodiment, when the row selected as the hammered row is one of the cold rows, the row selected as the hammered row may be removed from the cold table.

In an embodiment, a rank may be applied to the hot row stored in the hot table based on the number of times each hot row has been selected as the hammered row, a lowest rank may be applied to a new hot row stored in the hot table for the first time, and when the row selected as the hammered row is one of the hot rows, the rank of the row selected as the hammered row may be raised to the next rank level.

In an embodiment, ranks may be applied to the cold rows stored in the cold table, and a highest rank may be applied to a new cold row stored in the cold table for the first time.

In an embodiment, when the new hot row is stored in the hot table, an existing hot row of the lowest rank may be removed from the hot table and may be stored as the cold row of the highest rank in the cold table.

In an embodiment, when the new cold row is stored in the cold table, a cold row of the lowest rank of the cold table may be removed from the cold table if the cold table is in a full state.

In an embodiment, a row adjacent to an enabled row may be selected as the hammered row.

In an embodiment, a row adjacent to a row selected with a predetermined probability among enabled rows may be selected as the hammered row.

In an embodiment, eviction probabilities may be applied, by respective ranks, to the cold rows of the cold table. When the new cold row is stored in the cold table, one cold row selected based on the eviction probabilities among the cold rows of the cold table may be removed from the cold table if the cold table is in a full state.

In an embodiment, during a refresh operation of a memory device for preventing data loss due to row hammering, a row of the memory device corresponding to a hot row of a highest rank may be refreshed.

In an embodiment, when the hot row of the highest rank is not present, the refresh operation of the memory device for preventing the data loss due to the row hammering may not be performed.

In an embodiment, during a refresh operation of a memory device for preventing data loss due to row hammering, a row of the memory device corresponding to a hot row having a highest rank among the hot rows stored in the hot table may be refreshed.

In an embodiment, a memory controller for controlling a memory device may include: a circuit for selecting a row of memory cells of the memory device to be refreshed, comprising: a cold table suitable for storing as a cold row a row selected as a hammered row when the row selected as the hammered row is neither one of cold rows stored in the cold table nor one of hot rows stored in a hot table; and the hot table suitable for storing, as a hot row, the row selected as the hammered row when the row selected as the hammered row is one of the cold rows stored in the cold table.

In an embodiment, a memory device may include: a plurality of rows of memory cells; and a circuit for selecting a row of memory cells of the memory device to be refreshed, comprising: a cold table suitable for storing as a cold row a row selected as a hammered row when the row selected as the hammered row is neither one of cold rows stored in the cold table nor one of hot rows stored in a hot table; and the hot table suitable for storing, as a hot row, the row selected as the hammered row when the row selected as the hammered row is one of the cold rows stored in the cold table.

In an embodiment, a circuit for selecting a row to be refreshed may include: a cold table suitable for storing a plurality of cold rows having respective ranks; a hot table suitable for storing a plurality of hot rows having respective ranks; an input unit suitable for storing, as a cold row of a highest rank of the cold table, a row selected as a hammered row when the row selected as the hammered row is neither one of the cold rows nor one of the hot rows; a promotion unit suitable for storing, as a hot row of a lowest rank of the hot table, the row selected as the hammered row when the row selected as the hammered row is one of the cold rows, and raising the rank of the hammered row when the row selected as the hammer row is one of the hot rows; and an eviction unit suitable for removing one of the cold rows of the cold table if the cold table is in a full state when a new cold row is stored in the cold table.

In an embodiment, when the row selected as the hammered row is one of the cold rows, the promotion unit may remove the hammered row from the cold table.

In an embodiment, the input unit may select a row adjacent to an enabled row as the hammered row.

In an embodiment, the input unit may select, as the hammered row, a row adjacent to a row selected with a predetermined probability among enabled rows.

In an embodiment, during the removing, the eviction unit may remove a cold row of a lowest rank.

In an embodiment, eviction probabilities may be applied, by respective ranks, to the cold rows of the cold table, and, during the removing, the eviction unit may remove one cold row selected based on the eviction probabilities among the cold rows.

In an embodiment, during a refresh operation of a memory device for preventing data loss due to row hammering, a row of the memory device corresponding to a hot row of a highest rank may be refreshed.

In an embodiment, when the hot row of the highest rank is not present, the refresh operation of the memory device for preventing the data loss due to the row hammering may not be performed.

In an embodiment, during a refresh operation of a memory device for preventing data loss due to row hammering, a row of the memory device corresponding to a hot row having a highest rank among the hot rows stored in the hot table may be refreshed.

In an embodiment, a memory controller for controlling a memory device may include: a circuit for selecting a row to be refreshed, comprising: a cold table suitable for storing a plurality of cold rows having respective ranks; a hot table suitable for storing a plurality of hot rows having respective ranks; an input unit suitable for storing, as a cold row of a highest rank of the cold table, a row selected as a hammered row when the row selected as the hammered row is neither one of the cold rows nor one of the hot rows; a promotion unit suitable for storing, as a hot row of a lowest rank of the hot table, the row selected as the hammered row when the row selected as the hammered row is one of the cold rows, and raising the rank of the hammered row when the row selected as the hammer row is one of the hot rows; and an eviction unit suitable for removing one of the cold rows of the cold table if the cold table is in a full state when a new cold row is stored in the cold table.

In an embodiment, a memory device may include: a plurality of rows of memory cells; and a circuit for selecting a row to be refreshed, comprising: a cold table suitable for storing a plurality of cold rows having respective ranks; a hot table suitable for storing a plurality of hot rows having respective ranks; an input unit suitable for storing, as a cold row of a highest rank of the cold table, a row selected as a hammered row when the row selected as the hammered row is neither one of the cold rows nor one of the hot rows; a promotion unit suitable for storing, as a hot row of a lowest rank of the hot table, the row selected as the hammered row when the row selected as the hammered row is one of the cold rows, and raising the rank of the hammered row when the row selected as the hammer row is one of the hot rows; and an eviction unit suitable for removing one of the cold rows of the cold table if the cold table is in a full state when a new cold row is stored in the cold table.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
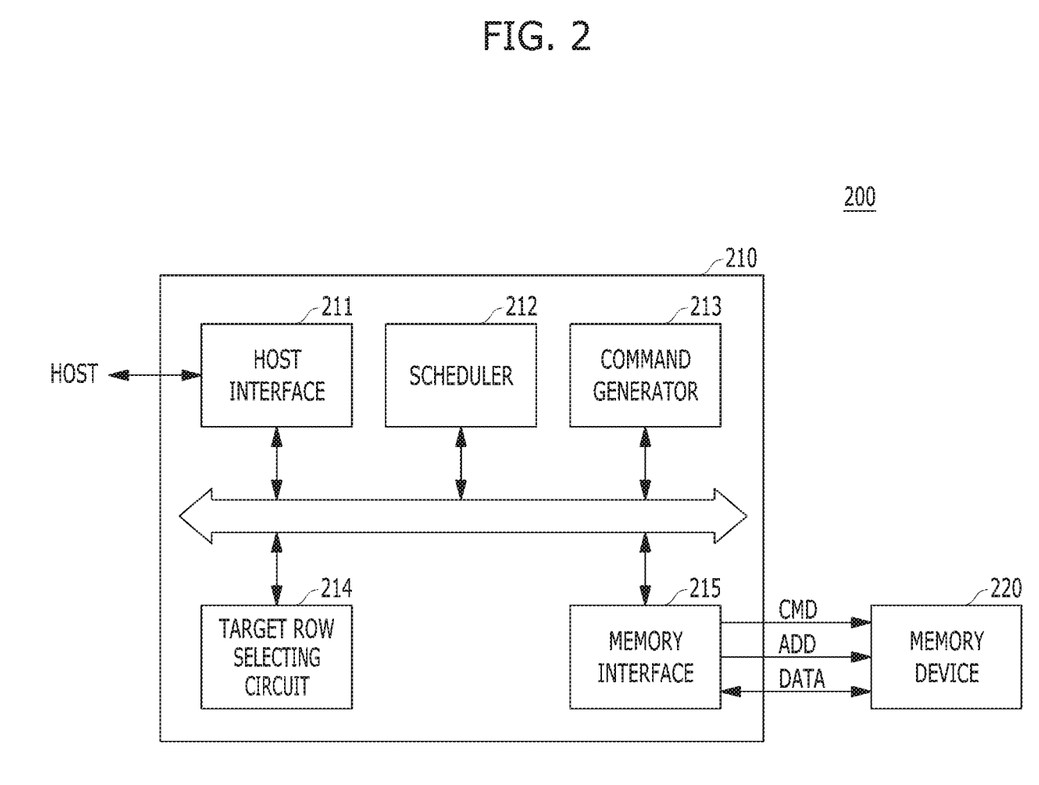
FIG. 2 is a diagram illustrating a configuration of a memory system in accordance with an embodiment.

FIG. 2 is a diagram illustrating a configuration of a memory system 200 in accordance with an embodiment.

Referring to FIG. 2, the memory system 200 may include a memory controller 210 and a memory device 220.

The memory controller 210 may control an operation of operation of the memory device 220 in response to a request from a HOST. Examples of suitable host devices may include a central processing unit (CPU), a graphic processing unit (GPU), an application processor (AP), and the like. The memory controller 210 may include a host interface 211, a scheduler 212, a command generator 213, a target row selecting circuit 214 for selecting a row to be refreshed, and a memory interface 215.

The host interface 211 may provide an interface between the memory controller 210 and the host HOST. Requests of the host HOST may be received through the host interface 211, and results of processing the requests may be transmitted to the host HOST through the host interface 211.

The scheduler 212 may determine for a plurality of requests received from the host HOST, a sequence according to which the requests are to be applied to the memory device 220. The scheduler 212 may select the sequence for enhancing the performance of the memory device 220 and thereby of the overall memory system. Hence, the scheduler determines the sequence according to which the operations corresponding to the received requests differ from the sequence of the requests received from the host HOST. Hence, the scheduler can determine a sequence of operations to be provided as instructions to the memory device 220 that differs from the sequence at which corresponding requests were received by the memory controller so that the performance of the memory device 220 may be enhanced. For example, even if the host HOST requests a read operation of the memory device 220 before requesting a write operation of the memory device 220, the sequence of requests may be adjusted such that the write operation is performed earlier than the read operation in order to optimize the operation of the memory device 220

The scheduler 212 may schedule refresh operations to be performed during intervals of the operations requested from the host HOST so as to prevent data of the memory device 220 from being lost. Each time a refresh command is applied from the memory controller 210 to the memory device 220 by scheduling of the scheduler 212, the memory device 220 may sequentially enable internal rows (i.e., word lines).

The scheduler 212 may schedule not only a general refresh operation but also an additional refresh operation for preventing data being lost by row hammering. The additional refresh operation may be performed by enabling a row having a high possibility of data loss attributable to the row hammering to be refreshed earlier, rather than sequentially refreshing the rows of the memory device 220. That is, during the additional refresh operation, an active command and an address of a row having a high possibility of data loss due to the row hammering may be applied from the memory controller 210 to the memory device 220. The row having a high possibility of data loss due to the row hammering may be selected by the target row selecting circuit 214. In an embodiment, the scheduler 212 may periodically schedule the additional refresh operation. For example, the additional refresh operation may be performed once each time the refresh operation is performed ten times. Alternatively, the additional refresh operation may be performed once each time the refresh operation is performed a hundred times.

The target row selecting circuit 214 may monitor an active command and an address to be applied from the memory controller 210 to the memory device 220, select a row having a high possibility of data loss due to row hammering, and provide information of the selected row to the scheduler 212 so that an additional refresh operation on the row having a high possibility of data loss due to row hammering may be performed.

The command generator 213 may generate a command to be applied to the memory device 220 according to the sequence of operations determined by the scheduler 212.

The memory interface 215 may provide an interface between the memory controller 210 and the memory device 220. A command CMD and an address ADD may be transmitted from the memory controller 210 to the memory device 220 through the memory interface 215, and data DATA may be exchanged therebetween through the memory interface 215. The memory interface 215 may also be called a PHY interface.

The memory device 220 may perform an operation instructed by the memory controller 210. The memory device 220 may be a memory device 220 that needs a refresh operation. For example, the memory device 220 may be a dynamic random access memory (DRAM) or may be another kind of memory device that requires a refresh operation.

Figure 3:
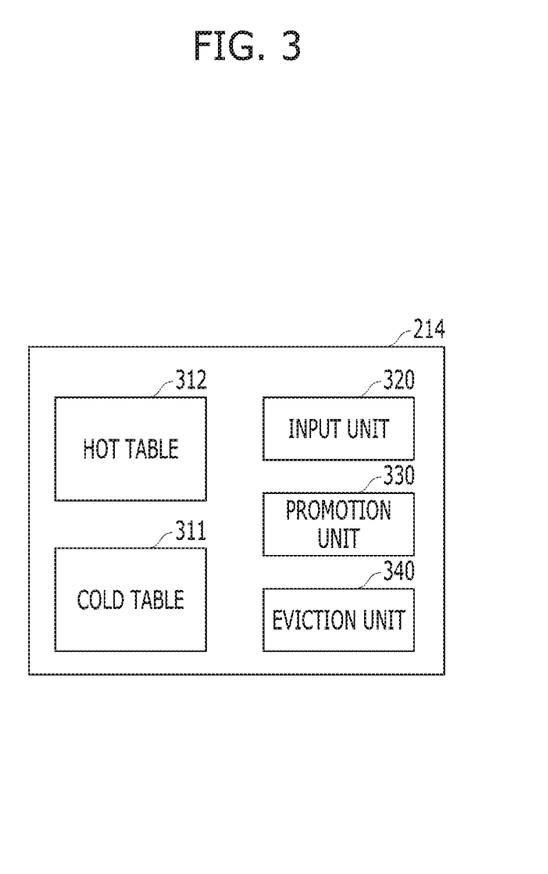
FIG. 3 is a diagram illustrating a configuration of an embodiment of a circuit for selecting a row of memory cells to be refreshed.

FIG. 3 is a diagram illustrating a configuration of an embodiment of the target row selecting circuit 214.

Referring to FIG. 3, the target row selecting circuit 214 may include a cold table 311, a hot table 312, an input unit 320, a promotion unit 330, and an eviction unit 340.

The cold table 311 may store a plurality of cold rows. The cold rows may refer to rows that have been stored neither in the cold table 311 nor the hot table 312 among rows selected as hammered rows. Ranks may be applied to the cold rows stored in the cold table 311.

The hot table 312 may store a plurality of hot rows. The hot rows may refer to rows that have been stored in the cold table 311 or the hot table 312 among the rows selected as the hammered rows. Ranks may be applied to the hot rows stored in the hot table 312. During an additional refresh operation, one of the hot rows may be refreshed. With regard to this, one of two methods including (1) and (2) may be used. In method (1), during the additional refresh operation, a hot row of a highest rank of the hot table 312, i.e., a hot row of rank 0, may be an additional refresh target. If the highest rank of the hot table 312 is empty, in other words, if rank 0 is empty, the additional refresh operation may not be performed. In method (2), during the additional refresh operation, a hot row of a highest rank among the hot rows of the hot table 312 may be an additional refresh target. For instance, if rank 0 is empty and a hot row of rank 1 is present, an additional refresh operation on the hot row of rank 1 may be performed. In the case where there is no hot row in the hot table 312, an additional refresh operation may not be performed.

The input unit 320 may select a hammered row and insert information of the selected hammered row into the cold table 311. One of two methods including (A) and (B) may be used as a method of selecting the hammered row by the input unit 320. In method (A), the input unit 320 may select all rows adjacent to an enabled row as hammered rows. For example, if row 3 is enabled, row 2 may be selected as a hammered row, and row 4 may be selected as a hammered row. In method (B), the input unit 320 may select, as hammered rows, only rows randomly selected from among rows adjacent to an enabled row. For example, among the rows adjacent to the enabled row, only a row selected with a probability of 10% may be selected as a hammered row. In detail, when row 3 is enabled, if row 3 is selected with the probability of 10%, row 2 and row 4 that are rows adjacent to row 3 may be selected as hammered rows. If row 3 is not selected with the probability of 10%, row 2 and row 4 may not be selected as hammered rows. Here, the operation of selecting enabled row 3 with the probability of 10% may be performed, e.g., by a method in which a random number of numbers from 1 to 100 is generated by a random number generator and if the generated random number is within a range from 1 to 10, it is determined that the third row has been selected with the probability of 10%, and if not, it is determined that the third row has been unselected with the probability of 10%. The phenomenon of data loss due to the row hammering is generated when a certain row is enabled one thousand or more times for a short period of time. Therefore, even if only 10% of rows adjacent to the enabled row are selected as hammered rows, there is no problem with determining a row having a probability of data loss. Compared to the case, e.g., method (A), where all of the rows adjacent to the enabled rows are selected as hammered rows, in the case, e.g., method (B), where rows adjacent to a row randomly selected from among the enabled rows are selected as hammered rows, the sizes of the cold table and the hot table may be reduced.

In the case where a selected hammered row is a row that is stored neither in the cold table 311 nor in the hot table 312, the input unit 320 may store the selected hammered row as a cold row in a highest rank, i.e., rank 0, of the cold table 311. In this case, the rank of each of the cold rows that have been already stored in the cold table 311 may be lowered by one level.

In the case where a hammered row selected by the input unit 320 is one of cold rows that have been stored in the cold table 311, the promotion unit 330 may remove the corresponding row from the cold table 311 and promote it as a hot row of a lowest rank of the hot table 312. In this case, an existing hot row that has been in the lowest rank of the hot table 312 may be transmitted to the highest rank of the cold table 311.

In the case where a hammered row selected by the input unit 320 is one of the hot rows that haven been stored in the hot table 312, the promotion unit 330 may raise the rank of the corresponding hot row by one level. As the rank of the hot row is raised by one level, the rank of a hot row that has been in a one-level higher rank may be lowered by one level. For example, if a hot row of rank 2 is raised to rank 1, an existing hot row of rank 1 may be lowered to rank 2.

The eviction unit 340 may remove, among the hot rows of the hot table 312, a hot row, on which the additional refresh operation has been performed, from the hot table 312. In the case where a new cold row is stored in the cold table 311, the eviction unit 340 may remove one of the cold rows from the cold table 311 if the cold table 311 is in a full state. As a method of removing one of the cold rows from the cold table 311 by the eviction unit 340, one of two methods including (I) and (II) may be used. In method (I), when a new cold row is stored in the cold table 311, the eviction unit 340 may remove a cold row of the lowest rank from the cold table 311 if the cold table 311 is in a full state. In method (II), when a new cold row is stored in the cold table 311, the eviction unit 340 may remove one cold row based on eviction probabilities given by ranks of cold rows. For example, in the case where four cold rows having ranks 0 to 3 are present in the cold table 311, eviction probabilities of 10%, 20%, 20%, and 50% may be respectively given thereto, and one cold row selected based on these eviction probabilities may be removed. Here, the operation of selecting one cold row based on the eviction probabilities may be performed by a method including generating a random number of numbers from 1 to 100, removing a cold row of rank 0 if the generated random number ranges from 1 to 10 corresponding to the eviction probability of 10%, removing a cold row of rank 1 if the generated random number ranges from 11 to 30 corresponding to the eviction probability of 20%, removing a cold row of rank 2 if the generated random number ranges from 31 to 50 corresponding to the eviction probability of 20%, and removing a cold row of rank 3 if the generated random number ranges from 51 to 100 corresponding to the eviction probability of 50%. The use of a method such as method (II) by the eviction unit 340 is to give slight unexpectedness to the method of selecting a row to be refreshed.

The target row selecting circuit 214 may select a row having a high possibility of data loss due to row hammering, based on a history of an enabled row, using simple configuration and method.

Figure 4:
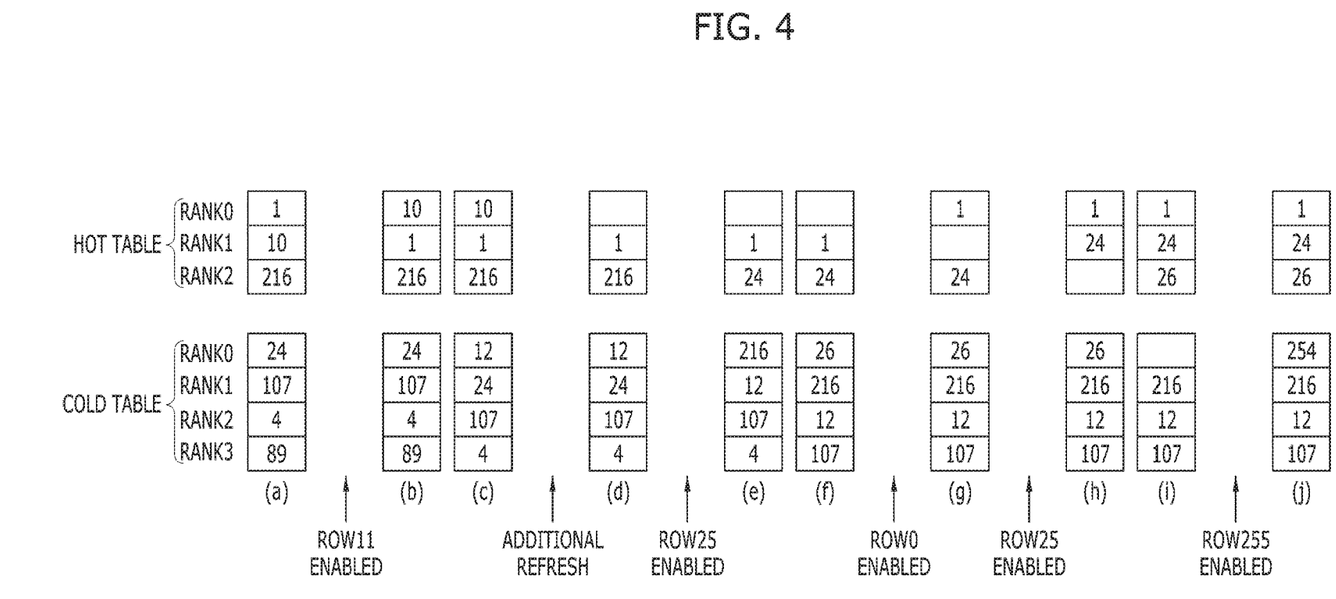
FIG. 4 is a diagram describing an operation of the target row selecting circuit.

FIG. 4 is a diagram describing the operation of the target row selecting circuit 214. For the sake of convenience in explanation, there will be described an example in which method (1) is used as a method of refreshing one of hot rows of the hot table 312, method (A) is used as a method of selecting a hammered row by the input unit 320, and method (I) is used as a method of removing a cold row by the eviction unit 340. Furthermore, there will be described an example in which the cold table 311 stores four cold rows, and the hot table 312 stores three hot rows. In addition, there will be described an example in which there are 256 rows from row 0 to row 255.

Referring to FIG. 4, in a state in which the hot table 312 and the cold table 311 are recorded as shown in (a), row 11 may be enabled. When row 11 is enabled, row 10 and row 12 that are adjacent to row 11 may be selected as hammered rows. Because row 10 is already stored as a hot row in the hot table 312, the rank of row 10 is raised from 1 to 0, so that the hot table 312 and the cold table 311 enter a state of (b). Because row 12 is in a state in which it is recorded neither in the hot table 312 nor in the cold table 311, row 12 enters rank 0 that is the highest rank of the cold table 311, row 107 and row 4 are lowered in rank, and row 89 is removed from the cold table 311. As a result, the hot table 312 and the cold table 311 enter a state of (c).

If an additional refresh operation is performed when the hot table 312 and the cold table 311 are in the state of (c), the additional refresh operation may be performed to row 10 in rank 0 of the hot table 312. In other words, the additional refresh operation may be performed to row 10 in the memory device 220. After the additional refresh operation has been performed, row 10 is removed from the hot table 312, so that the hot table 312 and the cold table 311 may enter a state of (d).

While the hot table 312 and the cold table 311 are in the state of (d), row 25 may be enabled. When row 25 is enabled, row 24 and row 26 that are adjacent to row 25 may be selected as hammered rows. Because row 24 is already stored in the cold table 311, row 24 may be moved to rank 2 that is the lowest rank of the hot table 312. Row 216 that has been in rank 2 of the hot table 312 may be moved to rank 0 of the cold table. Thereby, the hot table 312 and the cold table 311 may enter a state of (e). Because row 26 has been present neither in the hot table 312 nor in the cold table 311, row 26 is stored in rank 0 of the cold table 311. As a result, the hot table 312 and the cold table 311 may enter a state of (f).

While the hot table 312 and the cold table 311 are in the state of (f), row 0 may be enabled. When row 0 is enabled, row 1 that is adjacent to row 0 may be selected as a hammered row. Because row 1 is already stored in the hot table 312, the rank of row 1 is raised from 1 to 0, so that the hot table 311 and the cold table 311 enter a state of (g).

While the hot table 312 and the cold table 311 are in the state of (g), row 25 may be enabled. When row 25 is enabled, row 24 and row 26 that are adjacent to row 25 may be selected as hammered rows. Because row 24 is already stored in the hot table 312, the rank of row 24 is raised from 2 to 1, so that the hot table 311 and the cold table 311 may enter a state of (h). Since row 26 is already present in the cold table 311, row 26 is moved to rank 3 of the hot table 312 and removed from the cold table 311. Thus, the hot table and the cold table may enter a state of (i).

While the hot table 312 and the cold table 311 are in the state of (i), row 255 may be enabled. When row 255 is enabled, row 254 that is adjacent to row 255 may be selected as a hammered row. Because row 254 has been present neither in the hot table 312 nor in the cold table 311, row 254 is stored in rank 0 of the cold table 311. As a result, the hot table 312 and the cold table 311 may enter a state of (j).

Referring to FIG. 4, it may be understood that rows adjacent to a row enabled several times are stored in higher ranks in the hot table 312, and rows adjacent to the enabled row after a long time has passed after it has been enabled are gradually lowered in ranks and eventually removed from the cold table 311.

Figure 5:
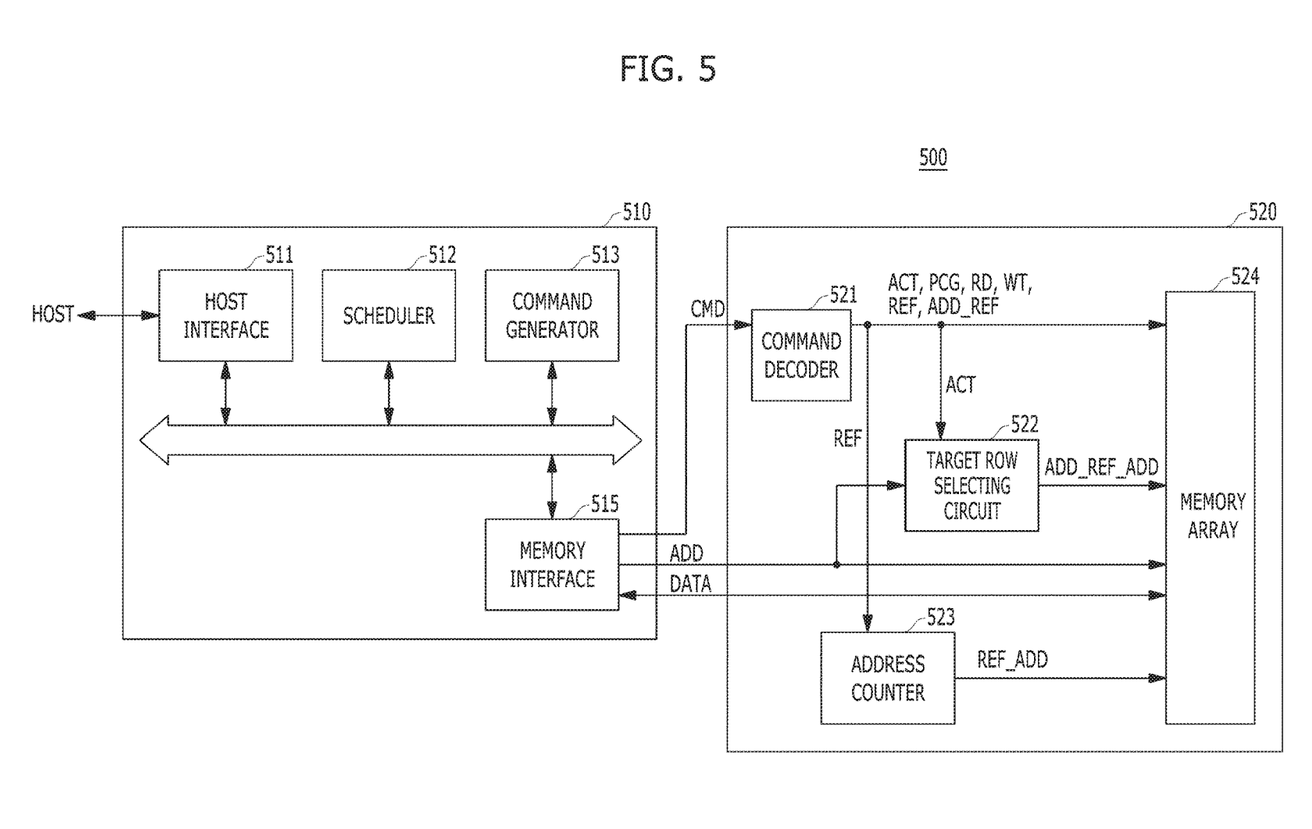
FIG. 5 is a diagram illustrating a configuration of a memory system in accordance with an embodiment.

FIG. 5 is a diagram illustrating a configuration of a memory system 500 in accordance with another embodiment.

Referring to FIG. 5, the memory system 500 may include a memory controller 510 and a memory device 520. In the memory system 500 of FIG. 5, a target row selecting circuit 522 for selecting a row to be refreshed may be included in the memory device 520 rather than in the memory controller 510.

The memory controller 510 may control an operation of the memory device 520 in response to a request from a HOST. Examples of the host HOST may include a central processing unit (CPU), a graphic processing unit (GPU), an application processor (AP), etc. The memory controller 510 may include a host interface 511, a scheduler 512, a command generator 513, and a memory interface 515.

The host interface 511 may be provided for interface between the memory controller 510 and the host HOST. Requests of the host HOST may be received through the host interface 511, and results of processing the requests may be transmitted to the host HOST through the host interface 511.

The scheduler 512 may determine, among requests from the host HOST, a sequence of requests to be applied to the memory device 520. The scheduler 512 may make a sequence of requests received from the host HOST and a sequence of operations to be provided as instructions to the memory device 520 differ from each other to enhance the performance of the memory device 520. For example, even if the host HOST requests a read operation of the memory device 520 before requesting a write operation of the memory device 520, the sequence of requests may be adjusted such that the write operation is performed earlier than the read operation.

The scheduler 512 may schedule refresh operations in intervals of the operations requested from the host HOST so as to prevent data of the memory device 520 from being lost. Each time a refresh command is applied from the memory controller 510 to the memory device 520 by scheduling of the scheduler 510, the memory device 520 may sequentially enable internal rows (i.e., word lines).

The scheduler 512 may schedule not only a general refresh operation but also an additional refresh operation for preventing data being lost by row hammering. In the embodiment of FIG. 5, since the target row selecting circuit 522 for selecting a row on which an additional refresh operation is to be performed is included in the memory device 520, the memory controller 510 may instruct the memory device 520 to perform the additional refresh operation by applying an additional refresh command to the memory device 520. The scheduler 512 may periodically schedule the additional refresh operation. For example, the additional refresh operation may be performed once each time the refresh operation is performed ten times. Alternatively, the additional refresh operation may be performed once each time the refresh operation is performed a hundred times.

The command generator 513 may generate a command to be applied to the memory device 520 according to the sequence of operations determined by the scheduler 512.

The memory interface 515 may be provided for interface between the memory controller 510 and the memory device 520. A command CMD and an address ADD may be transmitted from the memory controller 510 to the memory device 520 through the memory interface 515, and data DATA may be exchanged therebetween through the memory interface 515. The memory interface 515 may also be called a PHY interface.

The memory device 520 may perform an operation instructed by the memory controller 510. The memory device 520 may include a command decoder 521, the target row selecting circuit 522, an address counter 523, and a memory array 524.

The command decoder 521 may generate internal command signals ACT, PCG, RD, WT, REF, and ADD_REF by decoding a command CMD transmitted from the memory controller 510. The internal command signals may include an active signal ACT, a precharge signal PCG, a read signal RF, a write signal WT, a refresh signal REF, an additional refresh signal ADD_REF, and so forth.

The target row selecting circuit 522 may use an address ADD and an active signal ACT transmitted to the memory array 524 and select rows adjacent to a row enabled several times, i.e., rows on which an additional refresh operation should be performed. The target row selecting circuit 522 may have the same configuration and operation as those of the target row selecting circuit 214 described with reference to FIGS. 3 and 4. An additional refresh address ADD_REF_ADD to be outputted from the target row selecting circuit 522 is an address indicating a row on which the additional refresh operation should be performed, and may be an address indicating a row of the highest rank of the hot table 312.

The address counter 523 may change the refresh address REF_ADD each time the refresh signal REF is enabled. The refresh address REF_ADD generated from the address counter 523 may be used during the normal refresh operation rather than during the additional refresh operation.

The memory array 524 may perform operations indicated by the internal command signals ACT, PCG, RD, WT, REF, and ADD_REF. During the additional refresh operation during which the additional refresh signal ADD_REF is enabled, the memory array 524 may perform a refresh operation on a row selected by the additional refresh address ADD_REF_ADD. Furthermore, during the refresh operation during which the refresh signal REF is enabled, the memory array 524 may perform a refresh operation on a row selected by the refresh address REF_ADD. In addition, during an active, read, or write operation of the memory array 524, an address ADD transmitted from the memory controller 510 may be used. The memory array 524 may include elements such as a cell array, a row circuit for enabling/disabling rows of the cell array, and a column circuit for inputting/outputting data into/from the cell array, to perform operations such as active, precharge, read, write, refresh, and additional refresh operations.

In the embodiment of FIG. 2, there has been illustrated the case where the target row selecting circuit 214 is included in the memory controller 210, and in the embodiment of FIG. 5, there has been illustrated the case where the target row selecting circuit 522 is included in the memory device 520. However, these embodiments are only for illustrative purposes, and the target row selecting circuit may be disposed in other portions neither in the memory device nor in the memory controller. For example, the target row selecting circuit may be formed of a separate chip and disposed between the memory device and the memory controller.

In accordance with various embodiments, rows needed to be refreshed due to a row hammering phenomenon may be efficiently selected.

Although various embodiments have been described for illustrative purposes, it will be apparent to those skilled in the art that various changes and modifications may be made without departing from the spirit and scope of the invention as defined in the following claims.

What is claimed is:

1. A circuit for selecting a row of memory cells of a memory device to be refreshed, comprising:
   a cold table suitable for storing as a cold row a row selected as a hammered row when the row selected as the hammered row is neither one of cold rows stored in the cold table nor one of hot rows stored in a hot table; and
   the hot table suitable for storing, as a hot row, the row selected as the hammered row when the row selected as the hammered row is one of the cold rows stored in the cold table,
   wherein the hot rows stored in the hot table have respective ranks,
   wherein a lowest rank is applied to a new hot row stored in the hot table for the first time, and
   wherein, when the row selected as the hammered row is one of the hot rows, the rank of the row selected as the hammered row is raised to the next rank level.

2. The circuit of claim 1, wherein, when the row selected as the hammered row is one of the cold rows, the row selected as the hammered row is removed from the cold table.

3. The circuit of claim 2,
   wherein ranks are applied to the cold rows stored in the cold table, and
   wherein a highest rank is applied to a new cold row stored in the cold table for the first time.

4. The circuit of claim 3, wherein, when the new hot row is stored in the hot table, an existing hot row of the lowest rank is removed from the hot table and is stored as the cold row of the highest rank in the cold table.

5. The circuit of claim 4, wherein, when the new cold row is stored in the cold table, a cold row of the lowest rank of the cold table is removed from the cold table if the cold table is in a full state.

6. The circuit of claim 1, wherein a row adjacent to an enabled row is selected as the hammered row.

7. The circuit of claim 1, wherein a row adjacent to a row selected with a predetermined probability among enabled rows is selected as the hammered row.

8. The circuit of claim 4,
   wherein eviction probabilities are applied, by respective ranks, to the cold rows of the cold table, and
   wherein, when the new cold row is stored in the cold table, one cold row selected based on the eviction probabilities among the cold rows of the cold table is removed from the cold table if the cold table is in a full state.

9. The circuit of claim 2, wherein, during a refresh operation of a memory device for preventing data loss due to row hammering, a row of the memory device corresponding to a hot row of a highest rank is refreshed.

10. The circuit of claim 9, wherein, when there is no hot row present in the hot table having the highest rank, the refresh operation of the memory device for preventing the data loss due to the row hammering is not performed.

11. The circuit of claim 2, wherein, during a refresh operation of a memory device for preventing data loss due to row hammering, a row of the memory device corresponding to a hot row having a highest rank among the hot rows stored in the hot table is refreshed.

12. A circuit for selecting a row to be refreshed, comprising:
    a cold table suitable for storing a plurality of cold rows having respective ranks;
    a hot table suitable for storing a plurality of hot rows having respective ranks;
    an input unit suitable for storing, as a cold row of a highest rank of the cold table, a row selected as a hammered row when the row selected as the hammered row is neither one of the cold rows nor one of the hot rows;
    a promotion unit suitable for storing, as a hot row of a lowest rank of the hot table, the row selected as the hammered row when the row selected as the hammered row is one of the cold rows, and raising the rank of the hammered row when the row selected as the hammer row is one of the hot rows; and
    an eviction unit suitable for removing one of the cold rows of the cold table if the cold table is in a full state when a new cold row is stored in the cold table.

13. The circuit of claim 12, wherein, when the row selected as the hammered row is one of the cold rows, the promotion unit removes the hammered row from the cold table.

14. The circuit of claim 13, wherein the input unit selects a row adjacent to an enabled row as the hammered row.

15. The circuit of claim 13, wherein the input unit selects, as the hammered row, a row adjacent to a row selected with a predetermined probability among enabled rows.

16. The circuit of claim 13, wherein, during the removing, the eviction unit removes a cold rod of a lowest rank.

17. The circuit of claim 13,
    wherein eviction probabilities are applied, by respective ranks, to the cold rows of the cold table, and
    wherein, during the removing, the eviction unit removes one cold row selected based on the eviction probabilities among the cold rows.

18. The circuit of claim 13, wherein, during a refresh operation of a memory device for preventing data loss due to row hammering, a row of the memory device corresponding to a hot row of a highest rank is refreshed.

19. The circuit of claim 18, wherein, when the hot row of the highest rank is not present, the refresh operation of the memory device for preventing the data loss due to the row hammering is not performed.

20. The circuit of claim 13, wherein, during a refresh operation of a memory device for preventing data loss due to row hammering, a row of the memory device corresponding to a hot row having a highest rank among the hot rows stored in the hot table is refreshed.

* * * * *